US009275914B2

(12) United States Patent
Sato et al.

(10) Patent No.: US 9,275,914 B2
(45) Date of Patent: Mar. 1, 2016

(54) COATING APPARATUS AND MANUFACTURING METHOD OF COATED BODY

(71) Applicant: KABUSHIKI KAISHA TOSHIBA, Tokyo (JP)

(72) Inventors: Tsuyoshi Sato, Yokohama (JP); Kenichi Ooshiro, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 158 days.

(21) Appl. No.: 13/789,862

(22) Filed: Mar. 8, 2013

(65) Prior Publication Data

US 2013/0236990 A1    Sep. 12, 2013

(30) Foreign Application Priority Data

Mar. 8, 2012   (JP) .................................. 2012-051525

(51) Int. Cl.
*B05C 11/10*      (2006.01)
*B05C 11/02*      (2006.01)
(Continued)

(52) U.S. Cl.
CPC ............ *H01L 22/20* (2013.01); *H01L 21/6715* (2013.01); *H01L 22/26* (2013.01); *H01L 22/12* (2013.01); *H01L 2924/0002* (2013.01)

(58) Field of Classification Search
CPC .................................. B05C 11/02; B05C 11/10
USPC ........... 118/52, 612, 319, 320, 321, 323, 663, 118/679, 680, 692, 694, 302, 684
See application file for complete search history.

(56) References Cited

U.S. PATENT DOCUMENTS

| | | | | |
|---|---|---|---|---|
| 3,937,591 A | * | 2/1976 | Jantunen ........................ | 415/157 |
| 6,383,291 B1 | * | 5/2002 | Konishi .......................... | 118/313 |
| 6,635,113 B2 | * | 10/2003 | Takamori et al. ............. | 118/681 |

(Continued)

FOREIGN PATENT DOCUMENTS

| | | |
|---|---|---|
| CN | 101905205 A | 12/2010 |
| JP | 8-45816 A | 2/1996 |

(Continued)

OTHER PUBLICATIONS

Office Action issued on Jan. 7, 2014 in a basic/corresponding Japanese Patent Application No. 2012-051525 (with English Translation).

(Continued)

*Primary Examiner* — Yewebdar Tadesse
(74) *Attorney, Agent, or Firm* — Oblon, McClelland, Maier & Neustadt, L.L.P.

(57) ABSTRACT

According to one embodiment, a coating apparatus includes a stage having a mounting surface on which a coating target is mounted, a rotating mechanism that rotates the stage, a coating nozzle that discharges a coating material, a moving mechanism that moves the coating nozzle, a supply device that supplies a material to the coating nozzle, an ejection device that ejects the material, a communication tube that allows the supply device, and a valve device. Further, the coating apparatus includes a control unit which rotates the stage by the rotating mechanism, switches the valve device to achieve the continuity of the supply unit and the coating nozzle, drives the moving mechanism to move the coating nozzle, and applies the coating material to the coating target on the stage.

4 Claims, 4 Drawing Sheets

(51) Int. Cl.
 *H01L 21/66* (2006.01)
 *H01L 21/67* (2006.01)

(56) References Cited

U.S. PATENT DOCUMENTS

| | | | |
|---|---|---|---|
| 2002/0121341 A1* | 9/2002 | Tanaka et al. | 156/345.21 |
| 2004/0241320 A1 | 12/2004 | Minami et al. | |
| 2005/0058775 A1* | 3/2005 | Oku et al. | 427/240 |

FOREIGN PATENT DOCUMENTS

| | | |
|---|---|---|
| JP | 11-90295 A | 4/1999 |
| JP | 2001-310155 | 11/2001 |
| JP | 2002-164278 A | 6/2002 |
| JP | 2002-346451 A | 12/2002 |
| JP | 2003-117477 | 4/2003 |
| JP | 2003-272992 A | 9/2003 |
| JP | 2005-101100 A | 4/2005 |
| JP | 3776745 | 3/2006 |
| JP | 2009-101345 A | 5/2009 |
| JP | 4353628 B2 | 10/2009 |
| JP | 2010-103131 A | 5/2010 |
| JP | 2010-279932 | 12/2010 |

OTHER PUBLICATIONS

Office Action issued on Jan. 6, 2014 in a basic/corresponding Korean Patent Application No. 10-2013-24408 (with English Translation).
Combined Office Action and Search Report issued Mar. 30, 2015 in Chinese Patent Application No. 201310070805.9 (with English translation).
Office Action mailed on Jul. 20, 2015 in Taiwanese Application No. 102106319 (w/English translation).

* cited by examiner

COATING APPARATUS AND MANUFACTURING METHOD OF COATED BODY

CROSS-REFERENCE TO RELATED APPLICATIONS

This application is based upon and claims the benefit of priority from Japanese Patent Application No. 2012-051525, filed Mar. 8, 2012, the entire contents of which are incorporated herein by reference.

FIELD

Embodiments described herein relate generally to a coating apparatus and a manufacturing method of a coated body.

BACKGROUND

For example, in the field of, e.g., manufacture of semiconductors, there is known a coating apparatus that rotates a coating target such as a substrate, applies a material to this coating target, and thereby forms a film. There is known a technology that uses a coating method for performing so-called spiral coating, by which a material is applied to a coating target while forming a spiral trajectory, in regard to such a coating apparatus.

According to this coating method, a discoid coating target is fixed on a circular rotary stage, and a distance between a discharge surface of a coating nozzle and a substrate surface is maintained at a predetermined value. Then, the rotary stage is rotated, and the coating nozzle is linearly moved from the center toward an outer periphery of the coating target while discharging a coating material from the coating nozzle. This coating method is a method for discharging a material onto a rotating coating target, forming a spiral (coil-like) coating trajectory, and thereby forming a film on an entire surface of the coating target.

DETAILED DESCRIPTION

In general, according to one embodiment, a coating apparatus comprises: a stage having a mounting surface on which a coating target is mounted; a rotating mechanism that rotates the stage; a coating nozzle that discharges a coating material onto the coating target on the stage; a moving mechanism that moves the coating nozzle with respect to the coating target mounted on the stage; a supply device that supplies a material to the coating nozzle; an ejection device that ejects the material; a communication tube that allows the supply device, the coating nozzle, and the ejection device to communicate with each other; and a valve device which is provided in the communication tube and has a valve body that achieves any one of continuity of a supply unit and the coating nozzle, continuity of the supply device and the ejection device, and continuity of the coating nozzle and the ejection device and can switch the continuities. Further, the coating apparatus comprises a control unit which rotates the stage having the coating target mounted thereon by the rotating mechanism, switches the valve device to achieve the continuity of the supply unit and the coating nozzle, drives the moving mechanism to move the coating nozzle, and applies the coating material to the coating target on the stage.

A coating apparatus 1 according to this embodiment and a manufacturing method of a coated body 120 using the coating apparatus 1 will now be described hereinafter with reference to FIG. 1 to FIG. 5.

Figure 1:
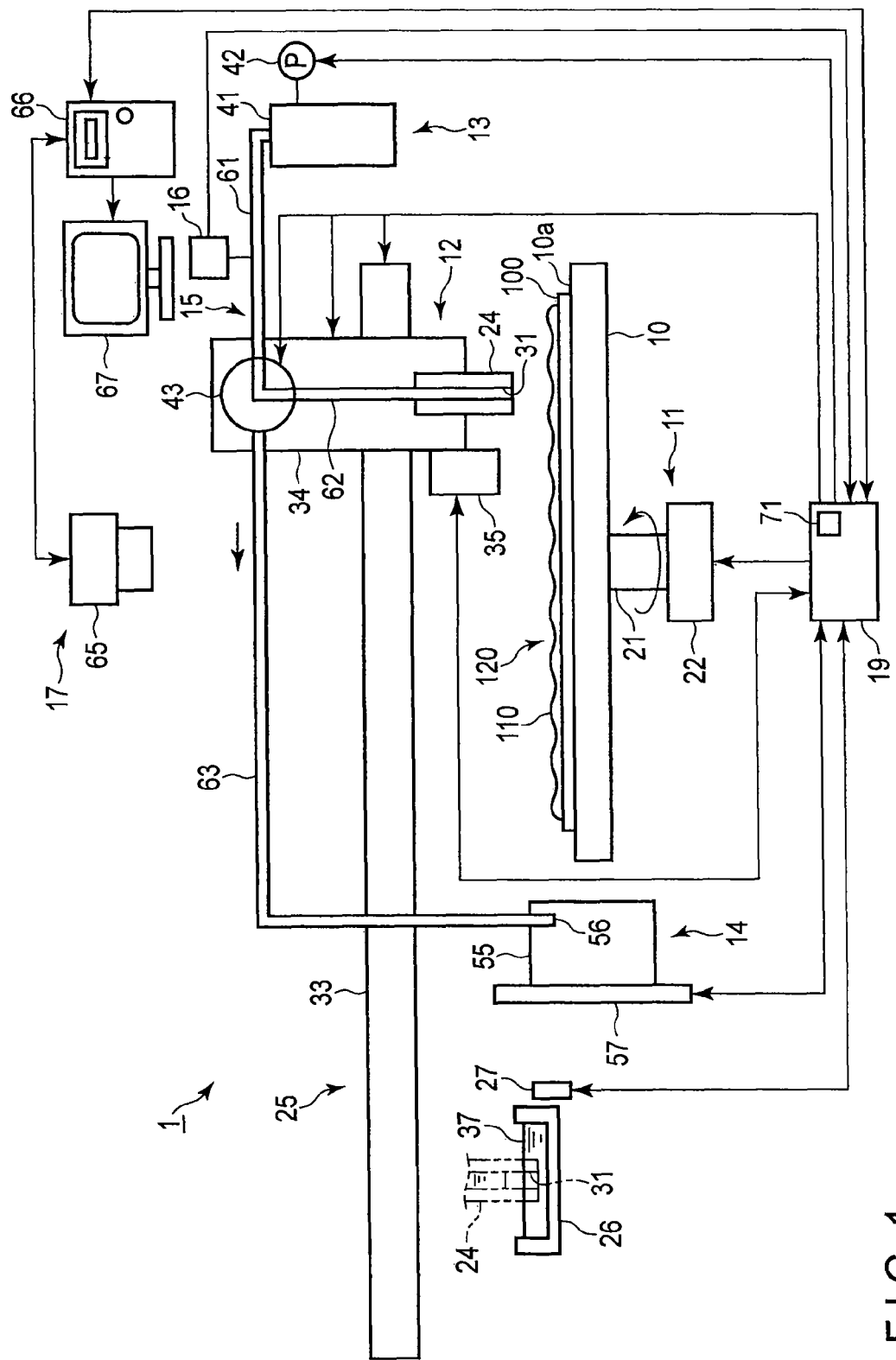
FIG. 1 is an explanatory view for schematically showing a configuration of a coating apparatus according to an embodiment.
Figure 2:
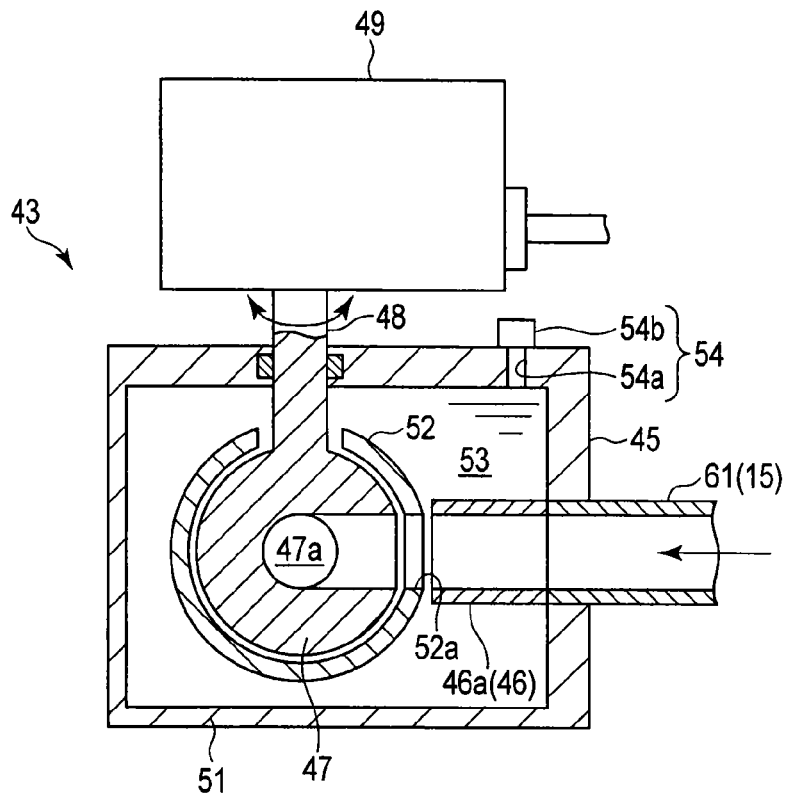
FIG. 2 is an explanatory view for schematically showing a configuration of a valve device used in the coating apparatus.
Figure 3:
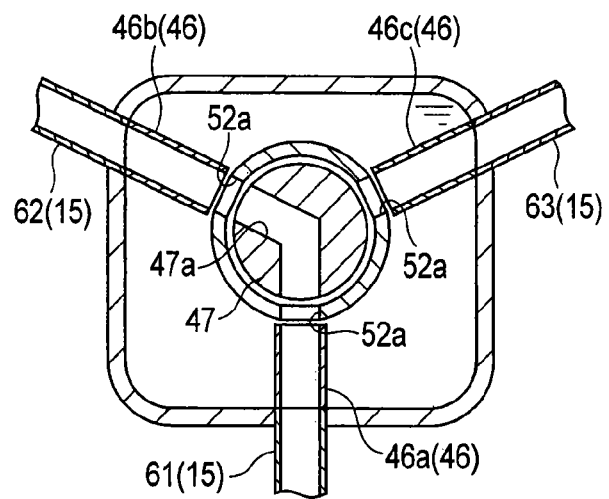
FIG. 3 is an explanatory view for schematically showing a configuration of the coating apparatus.
Figure 4:
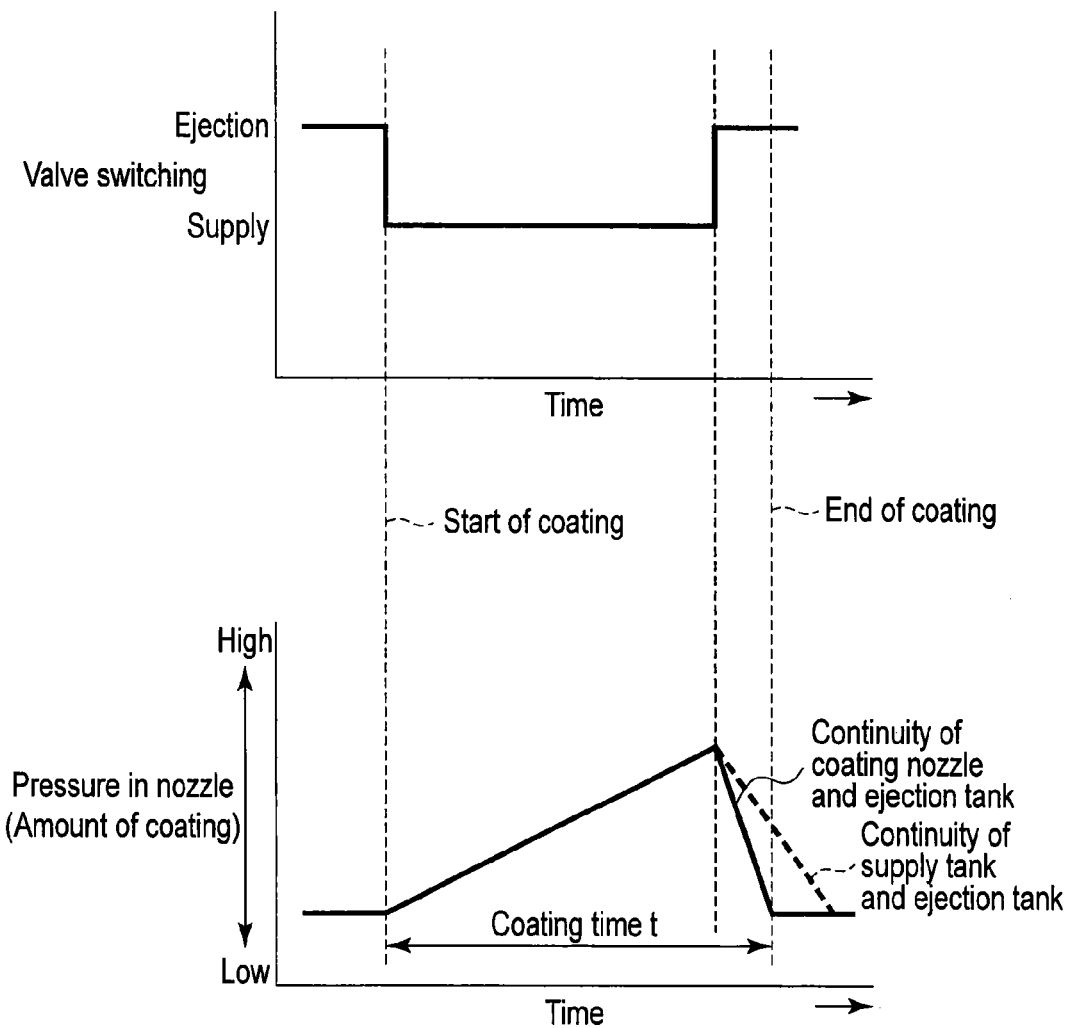
FIG. 4 is an explanatory view for showing a relationship between a pressure of a nozzle and switching of the valve device used in the coating apparatus.
Figure 5:
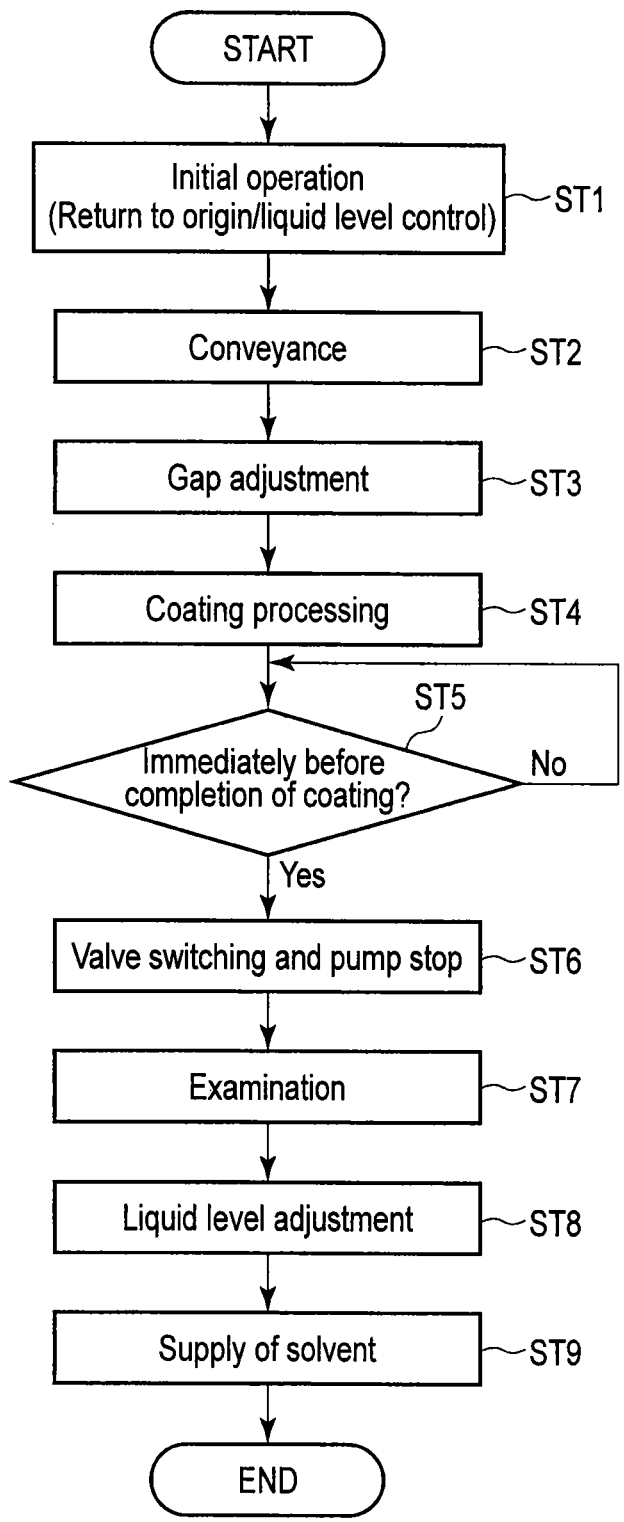
FIG. 5 is a flowchart showing an example of a manufacturing method using the coating apparatus.

FIG. 1 is an explanatory view schematically showing a configuration of the coating apparatus 1 according to this embodiment, FIG. 2 is a cross-sectional view schematically showing a configuration of a valve device 43 used in the coating apparatus 1, FIG. 3 is a cross-sectional view schematically showing a configuration of the valve device 43, FIG. 4 is an explanatory view for illustrating a relationship between a pressure of a coating nozzle 24 and switching of the valve device 43 used in the coating apparatus 1, and FIG. 5 is a flowchart showing an example of a manufacturing method using the coating apparatus 1.

The coating apparatus 1 is configured to be capable of forming a coating film 110 on a coating target by so-called spiral coating for applying a liquid coating material while rotating the coating target. For example, the coating target is a wafer 100 used in manufacture of a semiconductor. That is, the coating apparatus 1 is configured to be capable of manufacturing a coated body 120 having the wafer 100 whose upper side is coated with a coating film 110.

As shown in FIG. 1, the coating apparatus 1 comprises a stage 10 on which the wafer 100 is mounted and a rotating mechanism 11 that rotates the stage 10. The coating apparatus 1 comprises a nozzle device 12 that applies a coating material to the upper side of the stage 10, a supply device 13 that supplies the coating material to the nozzle device 12, an ejection device 14 that ejects part of the coating material, a communicate path 15 that forms a flow path of the coating material, and a pressure detection device 16 that can detect a pressure of the communication path 15. The coating apparatus 1 comprises a film detection device 17 that detects the coating material (the coating film 110) on the stage 10 and a control unit 19 that can control each component.

The stage 10 is formed into, e.g., a discoid shape. An upper surface of the stage 10 is formed flat, and a planar direction of the upper surface is extended in the horizontal direction. The stage 10 is formed in such a manner that it can rotate along the planar direction by the rotating mechanism 11. The upper surface of the stage 10 forms a mounting surface 10a on which the wafer 100 can be held and the wafer 100 can be fixed. It is to be noted that the stage 10 has an adsorbing mechanism that can adsorb the wafer 100 onto the mounting surface 10a by, e.g., air as means for fixing the wafer 100.

The rotating mechanism 11 comprises a rotary shaft 21 that rotatably supports the stage 10 and a drive unit 22 that drives the rotary shaft 21 to rotate. The drive unit 22 is, e.g., a motor that can rotate the rotary shaft 21. The drive unit 22 is connected to the control unit 19 and configured to switch rotation and stop of the rotary shaft 21, rotate the rotary shaft 21 at a predetermined number of revolutions, and vary the number of revolutions.

The nozzle device 12 comprises a coating nozzle 24 that discharges and applies a material to the upper surface of the wafer 100 on the mounting surface 10a, a moving mechanism 25 that can move the coating nozzle 24, a drying prevention device 26 that prevents drying of the coating nozzle 24, and liquid level detecting means 27 for detecting a liquid level of the coating material of the coating nozzle 24.

The coating nozzle 24 is configured to discharge a material that can become the coating film 110. In the coating nozzle 24 is formed a path portion 31 which allows the coating material to pass therethrough and has a circular channel cross section.

The moving mechanism 25 is configured to support the coating nozzle 24 and move the supported coating nozzle 24 in a planar direction of the mounting surface 10a of the stage 10 and a direction orthogonal to the planar direction. In other words, the moving mechanism 25 is configured to move and arrange the coating nozzle 24 onto the stage 10 and move the coating nozzle 24 closer to or away from the stage 10.

Specifically, the moving mechanism 25 comprises a first moving mechanism 33 and a second moving mechanism 34 that move the coating nozzle 24. The first moving mechanism 33 is configured to move the coating nozzle 24 in the plane direction of the mounting surface 10a of the stage 10 which is one direction running through the substantial center of the stage 10.

The second moving mechanism 34 is configured to move the coating nozzle 24 in a direction orthogonal to the moving direction of the first moving mechanism 33 which is a direction away from the stage 10. The second moving mechanism 34 is configured to move in the planar direction of the stage 10 together with the coating nozzle 24 by the first moving mechanism 33. Furthermore, the second moving mechanism 34 comprises a distance measurement unit 35 such as a reflection type laser sensor.

As each of the first moving mechanism 33 and the second moving mechanism 34, for example, a linear motor moving mechanism using a linear motor as a drive source or a screw moving mechanism using a motor as a drive source is used.

The distance measurement unit 35 moves in the planar direction of the mounting surface 10a together with the second moving mechanism 34 and is configured to measure a distance to the wafer 100 on the mounting surface 10a. The distance measurement unit 35 is configured to detect a surface roughness of a coating target surface of the wafer 100, namely, a height profile of the coating target surface based on the measured distance to the wafer 100. The distance measurement unit 35 is connected to the control unit 19 and configured to supply the detected information to the control unit 19.

The drying prevention device 26 is configured to prevent a distal end of the coating nozzle 24 from being dried by supplying a solvent to the distal end of the coating nozzle 24. For example, the drying prevention device 26 is a reservoir tank that can reserve a solvent 37 which is supplied to the distal end of the coating nozzle 24 and in which the coating nozzle 24 can be immersed in the reserved solvent 37. Here, the solvent can dissolve the coating material and, for example, gamma butyrolactone is used.

The drying prevention device 26 allows the coating nozzle 24, which has finished application of the coating material onto the wafer 100, to be immersed in the stored solvent 37, thereby prevents the distal end of the coating nozzle 24 from being dried, and avoids generation of dust due to the drying of a resin material at the distal end of the coating nozzle 24. It is to be noted that the drying prevention device 26 may have a configuration for supplying vapor of the solvent 37 to the distal end of the coating nozzle 24 or a configuration for spraying the solvent 37 in place of the configuration for immersing the distal end of the coating nozzle 24 in the stored solvent 37.

The liquid level detecting means 27 is configured to detect a distance from the distal end of the coating nozzle 24 to a meniscus which is a liquid level of a distal end of the coating material in the path portion 31. The liquid level detecting means 27 is, e.g., a laser displacement meter. The liquid level detecting means 27 is connected to the control unit 19 and configured to supply distance information of the detected liquid level to the control unit 19.

The supply device 13 comprises a supply tank 41 that stores the coating material, a supply pump 42 that intensifies a pressure of the coating material in the supply tank 41, and a valve device 43 provided in the communication path 15 that connects the supply tank 41 to the coating nozzle 24. Moreover, the supply device 13 has, e.g., a flow regulating valve that regulates a flow volume of the coating material to be supplied. The supply pump 42 comprises a pump unit and a motor and is connected to the control unit 19.

The valve device 43 is, e.g., an electromagnetic control valve and connected to the control unit 19. The valve device 43 is provided on the communication path 15 to achieve continuity of the supply tank 41 and the coating nozzle 24, continuity of the supply tank 41 and the ejection tank 55, and continuity of the coating nozzle 24 and the ejection tank 55. That is, the valve device 43 is a three-way valve that can switch a flow of the coating material in three directions. The three-way valve achieves the continuity of the supply tank 41 and the coating nozzle 24 and also achieves the continuity of the supply tank 41 and the ejection tank 55 or continuity of the coating nozzle 24 and the ejection tank 55 when switched in response to an instruction from the control unit 19.

In more detail, as shown in FIG. 2 and FIG. 3, the valve device 43 comprises an outer member 45, three flow path portions 46, a ball body 47 as a valve body, a rotary shaft 48, and switching means 49.

The outer member 45 is configured to have the flow path portions 46, the ball body 47, and part of the rotary shaft 48 arranged therein. The outer member 45 comprises an outer body 51 that forms an outer face shape and an inner body 52 that can support the ball body 47. A storage space 53 for the coating material that is a fluid is formed in the outer member 45, namely, between the outer body 51 and the inner body 52 of the outer member 45.

The outer body 51 is formed to have an inclined upper surface and comprises an air vent portion 54, which allows the storage space 53 to communicate with the outside and can ventilate the storage space 53, at a part of the upper surface or preferably at a position of the inclined upper surface having a large height. The air vent portion 54 has a hole portion 54a and a stopper 54b that closes the hole portion 54a.

The outer body 51 is constituted to rotate and support the rotary shaft 48 and seal the rotary shaft 48. The outer body 51 is configured to be connected to the communication path 15.

The inner body 52 is fixed in the outer body 51. The inner body 52 supports the ball body 47 and has three opening portions 52a, which support the ball body 47 and allow the flow path portions 46 to be continuous with the ball body 47, formed therein. The opening portions 52a are arranged to face the three flow path portions 46, respectively. The inner body 52 has a gap, which is continuous with the storage space 53, formed between its inner surface and an outer surface of the ball body 47. The inner body 52 is immersed in the coating material in the storage space 53. The inner body 52 may further have a gap, which is continuous with the storage space 53, between its outer surface and an end portion of each flow path portion 46.

Each flow path portion 46 has a flow path for a fluid, which is the coating material in this example, formed between the communication path 15 connected with the outer body 51 and each opening portion 52a of the inner body 52. The flow path portions 46 comprise a first flow path portion 46a connected with the communication path 15 connected to the supply tank 41, a second flow path portion 46b connected to the communication path 15 connected to the coating nozzle 24, and a third flow path portion 46c connected to the communication path 15 connected to the ejection tank 55. In the flow path portions 46, the first flow path portion 46a, the second flow path portion 46b, and the third flow path portion 46c are arranged at equal intervals, i.e., intervals of 120 degrees in the outer body 51 with the rotary shaft 48 of the ball body 47 at the center.

As shown in FIG. 3, the ball body 47 has a flow path 47a that can be connected to two of the first flow path portion 46a, the second flow path portion 46b, and the third flow path portion 46c and is inclined at 120 degrees. The ball body 47 is connected to the rotary shaft 48 and configured to revolve on the rotary shaft 48. The ball body 47 is immersed in the coating material in the storage space 53.

The switching means 49 is an electromagnetic actuator which can allow the rotary shaft 38 to revolve at intervals of 120 degrees. The switching means 49 is connected to the control unit 19 through a signal line or the like and allows the rotary shaft 38 to revolve in response to an instruction from the control unit 19.

The ejection device 14 comprises an ejection tank 55 that is connected to the communication path 15 and stores the ejected coating material, an ejection port 56 for the coating material that is formed at an end portion of the communication path 15 connected to the ejection tank 55 and communicates with the inside of the ejection tank 55, and an adjustment device 57 that adjusts a height of the ejection port 56.

The adjustment device 57 is connected to the control unit 19. The adjustment device 57 is a liquid level adjustment device that is configured to adjust the height of the ejection port 56, thereby vary a water head difference between the ejection port 56 and the coating nozzle 24, and adjust a liquid level height of the coating material in the coating nozzle 24.

The communication path 15 comprises a first communication path 61 that connects the supply tank 41 to the valve device 43, a second communication path 62 that connects the valve device 43 to the coating nozzle 24, and a third communication path 63 that connects the valve device 43 to the ejection tank 55. The first communication path 61 is connected to the first flow path unit 46a of the valve device 43. The second communication path 62 is connected to the second flow path unit 46b of the valve device 43.

The third communication path 63 is connected to the third flow path portion 46c of the valve device 43. Additionally, an opening at an end portion of the third communication path 63 connected to the ejection tank 55 constitutes the ejection port 56. When a height of the end portion of the third communication path 63 is adjusted by the adjustment device 57, a height of the ejection port 56 is adjusted.

The pressure detection device 16 is provided in the first communication path 61 or the second communication path 62 and configured to detect a pressure of the coating material supplied from the supply device 13. The pressure detection device 16 is connected to the control unit 19 and configured to supply information of the detected pressure to the control unit 19.

The film detection device 17 comprises an image acquisition unit 65 that acquires an image of the coating film 110 on the wafer 100 mounted on the stage 10, an image processing unit 66 that processes the image acquired by the image acquisition unit 65, and a display unit 67 that displays the image or the like subjected to the image processing.

The image acquisition unit 65 is provided above the stage 10 so that the entire surface of the wafer 100 of the mounting surface 10a can be observed. The image acquisition unit 65 acquires an image of the entire surface of the coating film 110 on the wafer 100. As the image acquisition unit 65, for example, an imaging unit such as a charge coupled device (CCD) camera or a sensor that applies light to a material and detects light reflected therefrom is used.

The image processing unit 66 is connected to the control unit 19 and configured to communicate with the control unit 19. The image processing unit 66 is configured to supply an image subjected to the image processing to the display unit 67 and the control unit 19. It is to be noted that the configuration where the image processing unit 66 is provided in the film detection device 17 is used, but the present embodiment is not restricted thereto, and a configuration where the image processing unit 66 is provided in the control unit 19 and the control unit 19 executes the image processing may be adopted. As the display unit 67, for example, a liquid crystal display (LCD) is used.

The control unit 19 is electrically connected to the pressure detection device 16, the drive unit 22, the liquid level detecting means 27, the first moving mechanism 33, the second moving mechanism 34, the distance measurement unit 35, a supply pump 42, the image processing unit 66, and the adjustment device 57.

The control unit 19 comprises a memory unit 71 that stores pressure information detected by the pressure detection device 16, distance information of a liquid level detected by the liquid level detecting means 27, distance information measured by the distance measurement unit 35, image data supplied from the image processing unit 66, and others. As the memory unit 71, for example, a memory or a hard disk drive (HDD) is used.

The control unit 19 is configured to drive the drive unit 22, the moving mechanism 25, and the supply pump 42, move the coating nozzle 24 while discharging the coating material from the coating nozzle 24 after the number of revolutions of the stage 10 has reached a predetermined number of revolutions, and apply the coating material onto the wafer 100.

The control unit 19 is configured to measure a distance (a gap) in the vertical direction between the coating nozzle 24 and the coating target surface of the wafer 100 obtained from a height profile detected by the distance measurement unit 35. The control unit 19 is configured to calculate a travel of the coating nozzle 24 in the planar direction at each position, i.e., a correction value which is an amount of drive of the second moving mechanism 34 from the measured gap.

Further, the control unit 19 is configured to drive the second moving mechanism 24 in accordance with the calculated correction value and a pressure detected by the pressure detection device 16 and control a coating position of the coating nozzle 24, i.e., a height from the wafer 100 to the distal end of the coating nozzle 24.

For example, when a coating position of the coating nozzle 24 in a height direction thereof based on the correction value calculated from the gap is determined as a predetermined position and the pressure detected by the pressure detection device 16 is higher than a predetermined pressure, the control unit 19 moves the coating nozzle 24 away from the wafer 100. Furthermore, when the pressure detected by the pressure detection device 16 is lower than the predetermined pressure, the control unit 19 moves the coating nozzle 24 toward the wafer 100 from the predetermined position.

The control unit 19 is configured to judge a missing part of coating, generation of foreign matter, a degree of unevenness in film thickness, and a shape of the coating film 110 based on relational information between the image data supplied from the image processing unit 66 and the film thickness and shading (an image density) which are stored in the memory unit 71.

Moreover, the control unit 19 has the following Functions (1) to (3).

Function (1): a function of switching the valve device 43 and changing over coating and ejection of the coating material.

Function (2): a function of adjusting a liquid level of the coating material in the coating nozzle 24 after end of application of the coating material onto the wafer 100.

Function (3): A function of supplying the solvent to the coating nozzle 24 after the adjustment of the liquid level in the coating nozzle 24.

These Functions (1) to (3) will now be described.

Function (1) is a function by which the control unit 19 drives the switching means 49 of the valve device 43, revolves the ball body 47, and switches connection of the first flow path portion 46a and the second flow path portion 46b, connection of the first flow path portion 46a and the third flow path portion 46c, and connection of the second flow path portion 46b and the third flow path portion 46c.

That is, Function (1) is a function by which the control unit 19 connects two of the first communication path 61, the second communication path 62, and the third communication path 63 by switching the valve device 43 and achieves one of continuity of the supply tank 41 and the coating nozzle 24, continuity of the supply tank 41 and the ejection tank 55, and continuity of the coating nozzle 24 and the ejection tank 55.

Here, the control unit 19 switches the valve device 43 at a time of applying the coating material onto the wafer 100, i.e., after the number of revolutions of the stage 10 has reached a predetermined number of revolutions at the time of coating, thereby connecting the first flow path portion 46a to the second flow path portion 46b. When this valve device 43 is switched, the supply tank 41 and the coating nozzle 24 become continuous through the first communication path 61, the valve device 43, and the second communication path 63.

The control unit 19 switches the valve device 43 at a time of changing application of the coating material to ejection of the same, i.e., at a time of completion of the application of the coating material onto the wafer 100 so that switching to the connection of the second flow path unit 46b and the third flow path unit 46c is carried out. When the valve device 43 is switched in this manner, the coating nozzle 24 and the ejection tank 55 become continuous through the second communication path 62, the valve device 43, and the third communication path 63.

When the control unit 19 achieves the continuity of the coating nozzle 24 and the ejection tank 55 by switching the valve device 43, it precipitously reduces a residual pressure (a nozzle pressure) in the coating nozzle 24, decreases an amount of application of coating material, prevents unnecessary application based on the residual pressure, and controls an amount of application.

At a time of ejecting the coating material from the supply device 13, the control unit 19 switches the valve device 43 and carries out the switching to the connection of the first flow path portion 46a and the third flow path portion 46c. It is to be noted that, as an example of ejecting the control material from the supply device 13, there is an air vent in the communication path 15 and the valve device 43 and others.

Function (2) is a function by which the control unit 19 detects a liquid level of the coating material in the coating nozzle 24 by using the liquid level detecting means 27, varies a height of the ejection port 56 in accordance with the detected liquid level, and adjusts the liquid level in the coating nozzle 24 to a predetermined liquid level.

Specifically, after end of the application to the wafer 100, the control unit 19 achieves the continuity of coating nozzle 24 and the ejection tank 55, drives the coating nozzle 24 to the liquid level detecting means 27 by using the moving mechanism 25, drives the liquid level detecting means 27, and detects the liquid level of the coating material in the coating nozzle 24. The control unit 19 receives this detection data, drives the adjustment device 57 based on this data, changes a height of the ejection port 56, and adjusts the liquid level in the coating nozzle 24 to a predetermined liquid level. In this manner, the control unit 19 adjusts the liquid level in the path portion 31 of the coating nozzle 24 to the predetermined liquid level.

Function (3) is a function by which the control unit 19 drives the first moving mechanism 33 and the second moving mechanism 34 after the adjustment of the liquid level in the coating nozzle 24 by Function (2) and the drying prevention device 26 supplies the solvent 37 to the distal end of the coating nozzle 24. Specifically, the control unit 19 drives the first moving mechanism 33 and the second moving mechanism 34 and immerses the distal end of the coating nozzle 24 in the solvent stored in the drying prevention device 26. Then, the control unit 19 drives the first moving mechanism 33 and the second moving mechanism 34, moves the coating nozzle 24 away from the drying prevention device 26, and thereby supplies the solvent 37 to the distal end of the coating nozzle 24.

A manufacturing method for applying the coating material onto the wafer 100 which is a coating target by using the thus configured coating apparatus 1 and manufacturing the coated body 120 will now be described hereinafter with reference to a flowchart of FIG. 5.

As shown in the flowchart of FIG. 5, first, the control unit 19 performs an initial operation such as return to origin or liquid level control (a step ST1). For example, as the return to origin, the control unit 19 drives the moving mechanism 25 and moves the coating nozzle 24 to a predetermined position on the stage 10 which is specifically a position facing the center of the wafer 100 held on the stage 10 as a coating start position.

Further, as the liquid level control, the control unit 19 drives the adjustment device 57, sets a height of the ejection port 56 to a predetermined height, and thereby adjusts a liquid level in the coating nozzle 24 based on a water head difference between the distal end of the coating nozzle 24 and the ejection port 56. At this time, the control unit 19 controls the valve device 43 and achieves the continuity of the second communication path 62 and the third communication path 63. Furthermore, the control unit 19 adjusts a height of the liquid level in the path portion 31 based on, e.g., viscosity of the coating material stored in the memory unit 71 or a channel area of the path portion 31 in the coating nozzle 24 so that an appropriate amount can be applied from the distal end of the coating nozzle 24.

Subsequently, the wafer 100 is mounted on the mounting surface 10a of the stage 10 by conveying equipment such as a robot (a step ST2). After the wafer 100 is conveyed onto the mounting surface 10a, the adsorbing mechanism is driven, and the wafer 100 is thereby fixed on the mounting surface 10a.

Then, a height between the coating nozzle 24 and the coating target surface of the wafer 100 is adjusted (a step ST3). Specifically, after the wafer 100 is fixed on the stage 10, the control unit 19 drives the first moving mechanism 33 and the distance measurement unit 35, detects a height profile, and measures a gap. Subsequently, the control unit 19 calculates a correction value of the second moving mechanism 34 from the detected gap so that a distance (the gap) between the coating nozzle 24 and the coating target surface of the wafer 100 in the vertical direction becomes a set value. The control unit 19 drives the second moving mechanism 34 based on the calculated correction value and adjusts a position of the coating nozzle 24 in a height direction.

Then, coating processing for coating the wafer 100 with the coating material is carried out (a step ST4). As this coating processing, first, the control unit 19 drives the drive unit 22 and rotates the stage 10 having the wafer 100 fixed on the mounting surface 10a at a predetermined number of revolutions.

After the stage 10 is rotated at the predetermined number of revolutions, as start of application of the coating material, the control unit 19 switches the valve device 43 as shown in FIG. 4, achieves the continuity of the supply tank 41 and the coating nozzle 24, and drives the supply pump 42. At the same time, the control unit 19 drives the first moving mechanism 33 and moves the coating nozzle 24 from an origin position, i.e., the center on the wafer 100 toward the outer edge side in the planar direction at a predetermined speed.

It is to be noted that the control unit 19 previously calculates a moving speed of the coating nozzle 24 based on conditions such as a shape of the wafer 100, a supply pressure and viscosity of the coating material, a number of revolutions of the stage 10, a channel cross-sectional area of the coating nozzle 24 and others, obtains a coating time t which is a drive time of the first moving mechanism 33 in other words, from the moving speed, and stores it in the memory unit 71.

The control unit 19 drives the first moving mechanism 33 based on this coating time t stored in the memory unit 71. The control unit 19 counts a lapse of time from the start of coating which is the drive time of the first moving mechanism 33 in other words. The control unit 19 judges whether the counted coating time has reached a point immediately before end of the drive time of the first moving mechanism 33 (completion of coating), namely, whether the coating nozzle 24 has reached a position immediately before the outer edge of the wafer 100 which is an outer edge of a coating region (a step ST5).

It is to be noted that the coating time immediately before the completion of coating is determined based on conditions, e.g., a shape of the wafer 100, a supply pressure and viscosity of the coating material, a number of revolutions of the stage 10, a channel cross-sectional area of the coating nozzle 24, and others, and it is set to a time corresponding to a point which is several mm before a coating completion position, e.g., a point that is approximately several seconds before the coating time t at which the coating is completed. Furthermore, the coating time that is immediately before the completion of coating is stored as a threshold value in the memory unit 71 in advance.

If the drive time of the first moving mechanism 33 is not determined to be the coating time that is immediately before the completion of coating (NO at the step ST5) based on the judgment (the step ST5), the first moving mechanism 33 is continuously driven, the drive time is counted, and the judgment is repeatedly made (the step ST5).

If the drive time of the first moving mechanism 33 is determined to be the coating time that is immediately before the completion of coating (YES at the step ST5) based on the judgment (the step ST5), the control unit 19 determines that the coating nozzle 24 is about to be placed on the outer edge of the wafer 100. Based on this determination, the control unit 19 switches the valve device 43, achieves the continuity of the coating nozzle 24 and the ejection tank 55, and stops the supply pump 42 (a step ST6).

Moreover, the control unit 19 drives the adjustment device 57 and adjusts a position of the ejection port 56 in such a manner that the ejection port 56 is placed at a position lower than the distal end of the coating nozzle 24 before or simultaneously with the switching of the valve device 43. When the ejection port 56 is placed at the position lower than the distal end of the coating nozzle 24, a water head difference can be provided between the distal end of the coating nozzle 24 and the ejection port 56.

In this manner, the control unit 19 precipitously reduces a residual pressure in each of the coating nozzle 24 and the second communication path 62 based on the continuity of the coating nozzle 24 and the ejection tank 55 and the water head difference between the distal end of the coating nozzle 24 and the ejection port 56, and decreases an amount of the coating material discharged from the coating nozzle 24 (an amount of coating).

That is, when the coating nozzle 24 is placed on the outer edge of the wafer 100, the control unit 19 prevents unnecessary coating based on the residual pressure, thereby adjusting an amount of coating of the coating material with respect to the outer edge of the coating region of the wafer 100. Additionally, after the drive time of the first moving mechanism 33 is finished, the control unit 19 stops the drive of the first moving mechanism 33.

In this manner, when the control unit 19 achieves the continuity of the supply tank 41 and the coating nozzle 24 and controls the drive unit 22, the supply device 13, and the moving mechanism 25, the coating nozzle 24 continuously discharges the coating material onto the wafer 100 while moving and applies the material onto the wafer 100 in a spiral pattern (spiral coating). The material applied in the spiral pattern in this manner spreads by the centrifugal force caused due to rotation of the wafer 100, and the coating film 110 is formed on the coating target surface of the wafer 100.

Then, the coating film 110 on the wafer 100 is examined by the film detection device 17 (a step ST8), presence/absence of a missing part of the coating film 110, presence/absence of foreign particles in the coating film 110, presence/absence of film thickness abnormality, a shape of the coating film 110, and others are monitored, and repair processing for performing partial coating is carried out as required. The wafer 100 as a coating target is coated with the coating material in this manner, and the coated body 120 having the coating film 110 formed on the wafer 100 is manufactured.

Then, the control unit 19 adjusts a liquid level of the coating material in the coating nozzle 24 (a step ST8). Specifically, first, the control unit 19 drives the first moving mechanism 33 and the second moving mechanism 34 and moves the coating nozzle 24 to the liquid level detecting means 27. Subsequently, the control unit 19 detects a liquid level in the coating nozzle 24 by using the liquid level detecting means 27, drives the adjustment device 57 in accordance with the detected liquid level, changes a water head difference between the distal end of the coating nozzle 24 and the ejection port 56, and adjusts the liquid level in the coating nozzle 24 to a predetermined liquid level height.

Subsequently, the control unit 19 drives the first moving mechanism 33 and the second moving mechanism 34, immerses the distal end of the coating nozzle 24 in the solvent 37 stored in the drying prevention device 26, and supplies the solvent 37 to the distal end of the coating nozzle 24 (a step ST9). When the solvent 37 is supplied in this manner, the coating nozzle 24 can be prevented from being dried and is set in a standby mode until the film formation of the subsequent wafer 100.

According to the thus configured coating apparatus 1 and the manufacturing method of the coated body 120, when the switching is carried out by the valve device 43 which is the three-way valve, a flow direction of the coating material can be readily changed over.

Further, when the continuity of the coating nozzle 24 and the ejection tank 55 is realized immediately before the completion of the coating by using the valve device 43, the coating apparatus 1 can reduce a pressure (the residual pressure) in the coating nozzle 24 in a short time. Furthermore, the coating apparatus 1 can release the residual pressure in the coating nozzle 24 to the ejection tank 55 by realizing the continuity of the coating nozzle 24 and the ejection tank 55. As a result, when the continuity of the coating nozzle 24 and the ejection tank 55 is achieved, the coating apparatus 1 can reduce the residual pressure in a shorter time than that in a case where the supply tank 41 and the ejection tank 55 indicated by a broken line in FIG. 4 are switched, thereby decreasing an amount of the coating material applied from the coating nozzle 24.

As a result, at a position where the coating is completed, namely, at a boundary between a region where the coating material is applied and a region where the coating material is not applied, unnecessary coating using the residual pressure can be avoided, a film thickness above the wafer 100 can be uniformed, and the coating in regions other than the coating region of the wafer 100 can be avoided. When the coating in regions other than the coating region is avoided, a process of removing the unnecessary coating material, called edge cut, of the wafer 100 can be prevented, and an amount of thinner used for the edge cut can be reduced.

Furthermore, the valve device 43 is configured to have the storage space 53 where the coating material is stored in the outer member 45 and also have the gap that is continuous with the storage space 53 between the outer surface of the ball body 47 and the inner surface of the inner body 52. Moreover, in the valve device 43, the coating material is stored in the storage space 53. Therefore, since the coating material is interposed between the outer surface of the ball body 47 and the inner surface of the inner body 52, the coating material constitutes a lubricant, and it is possible to avoid generation of dust such as contamination like slide powder that is produced due to unlubricated sliding of the ball body 47 and the inner body 52.

Additionally, since the coating material is used for lubrication, a lubricant does not have to be additionally used for each slide portion. As described above, since the valve device 43 stores the coating material therein and uses the coating material as a lubricant, it is possible to prevent foreign matter, i.e., dust generated due to the lubricant or dry sliding from being contained in the coating material.

Further, since the inside of the outer member 45 is filled with the coating material, it is possible to avoid generation of air due to the switching of the valve device 43, namely, mixture of air into the supplied coating material at the time of the switching of the valve device 43. When the mixture of air into the coating material is avoided, an amount of supply of the coating material can be prevented from varying or air can be prevented from being mixed in the formed film.

Furthermore, when coating the wafer 100 with the coating material is started after the stage 10 has reached a predetermined number of revolutions, a portion of the coating material that is immersed in the liquid, namely a coating start portion can be prevented from having a large film thickness, and a constant film thickness can be provided.

That is, a cause of, e.g., wetting of the coating material on the wafer 100 functions in a stationary phase, and this function is reduced by a turning force. Moreover, when the coating material is applied onto the wafer 100 at the predetermined number of revolutions, the coating material spreads toward the outer peripheral side due to the centrifugal force. Therefore, when the coating material is applied onto the wafer 100 after the stage 10 has reached the predetermined number of revolutions, a fixed film thickness can be provided on the central side of the wafer 100.

Additionally, after the completion of coating, the liquid level in the coating nozzle 24 is adjusted and the solvent 37 is supplied to the distal end of the coating nozzle 24 by the drying prevention device 26, the coating material is not exposed to outside air as much as possible. The coating material adhering to the distal end of the coating nozzle 24 is covered with the solvent 37, and the adherent coating material can be prevented from being dried. Further, even if the dried coating material is placed at the distal end of the coating nozzle 24, the dried coating material can be dissolved by using the solvent 37. As a result, delamination or the like due to dryness of the coating material adhering to the distal end of the coating nozzle 24 can be avoided.

In more detail, when the coating material adhering to the distal end of the coating nozzle 24 is dried and delaminated, the removed material turns to dust and may be mixed into the coating material and may be mixed into the film formed on the wafer. However, when the solvent 37 is supplied to the distal end of the coating nozzle 24, the coating material adhering to the distal end of the coating nozzle 24 can be prevented from being dried and, if the dried coating material is present, the dried coating material can be dissolved, and generation of dust can be avoided.

As described above, according to the coating apparatus 1 and the manufacturing method of the coated body 120 of this embodiment, even if the coating material is applied onto the coating target 100 in a spiral pattern, a uniform film thickness can be formed.

It is to be noted that the coating apparatus 1 according to this embodiment is not restricted to the foregoing configuration. For example, as the valve device 43 according to this embodiment, the configuration using the ball valve has been described, but the present embodiment is not restricted thereto. The valve device 43 may be a rotary valve or a valve that is switched by linear movement as long as it can realize the continuity of the supply tank 41 and the coating nozzle 24, that of the supply tank 41 and the ejection tank 55, and that of the coating nozzle 24 and the ejection tank 55 and can switch the continuity in the three directions.

Further, in the foregoing embodiment, the description has been given as to the configuration in which the adjustment device 57 which is the liquid level adjustment device is driven, a height of the ejection port 56 is changed, and a height of the liquid level of the coating material in the coating nozzle 24 is adjusted based on a water head difference from the distal end of the coating nozzle 24, but the present embodiment is not restricted thereto. For example, the liquid level adjustment device may be formed of the supply pump 42 and the pressure detection device 16. That is, in the case of adjusting a height of the liquid level in the coating nozzle 24 by the liquid level adjustment device, a pressure in the coating nozzle 24 may be changed by the supply pump 42 based on a pressure detected by the pressure detection device 16, and the liquid level may be moved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A coating apparatus comprising:
    a stage which has a mounting surface on which a coating target is mounted;
    a rotating mechanism which rotates the stage;
    a coating nozzle which discharges a coating material toward the coating target on the stage;
    a moving mechanism which moves the coating nozzle with respect to the coating target mounted on the stage;
    a supply device which supplies the material to the coating nozzle;
    an ejection device which ejects the material;
    a communication tube which communicates with the supply device, the coating nozzle, and the ejection device;
    a valve device including a valve body which is provided in the communication tube and configured to achieve one of continuity of the supply device and the coating nozzle, that of the supply device and the ejection device, and that of the coating nozzle and the ejection device and switch the continuities;
    a control unit which rotates the stage having the coating target mounted thereon by using the rotating mechanism, switches the valve device, achieves the continuity of the supply device and the coating nozzle, drives the moving mechanism, moves the coating nozzle, and applies the coating material to the coating target on the stage;
    wherein the control unit moves the coating nozzle toward an outer peripheral side from the center of the coating target, applies the coating material to the coating target, and switches the valve device to realize the continuity of the coating nozzle and the ejection device, immediately before completion of application of the coating material;
    a liquid level detection device which detects a liquid level of the coating material in the coating nozzle;
    an adjustment device which adjusts a height of the liquid level in the coating nozzle;
    wherein
    the control unit drives the adjustment device based on the liquid level detected by the liquid level detection device and adjusts a height of the liquid level in the coating nozzle to a predetermined height of the liquid level,
    the ejection device includes an ejection tank and an ejection port communicating with the ejection tank and configured to eject the material,
    the adjustment device adjusts the height of the liquid level in the coating nozzle by adjusting a height of the ejection port relative to the distal end of the coating nozzle, and
    the control unit drives the adjustment device and adjusts a position of the ejection port such that the ejection port becomes lower than a distal end of the coating nozzle before or simultaneously with the switching of the valve device.

2. The apparatus according to claim 1,
    wherein the valve device comprises an outer member that has a storage space which stores the coating material formed therein, and the valve body is arranged in the outer member and is immersed in the coating material stored in the storage space.

3. The apparatus according to claim 1, further comprising a pressure detection device which is provided in the communication tube and detects a pressure in the coating nozzle,
    wherein the moving mechanism is configured to move the coating nozzle away from or closer to the coating target mounted on the stage, and
    the control unit controls the moving mechanism in accordance with a pressure in the coating nozzle detected by the pressure detection device and moves the coating nozzle away from or closer to the coating target.

4. The apparatus according to claim 1, further comprising at a distal end of the coating nozzle a drying prevention device which supplies a solvent that dissolves the coating material,
    wherein the control unit supplies the solvent to the coating nozzle by using the drying prevention device after the liquid level in the coating nozzle is adjusted to the predetermined height of the liquid level.

* * * * *